(12) United States Patent
Kearney et al.

(10) Patent No.: US 10,680,624 B2
(45) Date of Patent: Jun. 9, 2020

(54) PHASE-LOCKED LOOP WITH FILTERED QUANTIZATION NOISE

(71) Applicant: Analog Devices Global Unlimited Company, Hamilton (BM)

(72) Inventors: Niall Kevin Kearney, Killeagh (IE); Philip Eugene Quinlan, Glounthaune (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/129,599

(22) Filed: Sep. 12, 2018

(65) Prior Publication Data

US 2019/0280698 A1 Sep. 12, 2019

Related U.S. Application Data

(60) Provisional application No. 62/639,821, filed on Mar. 7, 2018.

(51) Int. Cl.
| | |
|---|---|
| *H03L 7/093* | (2006.01) |
| *H03L 7/197* | (2006.01) |
| *H03C 3/09* | (2006.01) |
| *H03L 7/087* | (2006.01) |

(52) U.S. Cl.
CPC .......... *H03L 7/093* (2013.01); *H03C 3/0925* (2013.01); *H03C 3/0933* (2013.01); *H03L 7/087* (2013.01); *H03L 7/197* (2013.01)

(58) Field of Classification Search
CPC ......... H03L 7/093; H03L 7/197; H03L 7/087; H03C 3/0925; H03C 3/0933; H03C 3/0941
See application file for complete search history.

(56) References Cited

U.S. PATENT DOCUMENTS

| | | | |
|---|---|---|---|
| 6,392,493 B1 | 5/2002 | Minnis | |
| 6,553,089 B2 | 4/2003 | Huh et al. | |
| 7,912,145 B2 | 3/2011 | Yellin et al. | |
| 8,310,886 B2 | 11/2012 | Rhee et al. | |
| 8,446,190 B2 | 5/2013 | Rhee et al. | |
| 9,484,939 B2 | 11/2016 | Luo et al. | |
| 9,503,103 B2 | 11/2016 | Chou | |

(Continued)

FOREIGN PATENT DOCUMENTS

KR 101601023 B1 3/2016

OTHER PUBLICATIONS

Bornoose, et al., "Reduced complexity 1-bit high-order digital delta-sigma modulator for low-voltage fractional-N frequency synthesis applications," IEE Proc.-Circuits Devices Syst., vol. 152, No. 5, Oct. 2005, pp. 471-477.

(Continued)

*Primary Examiner* — Vineeta S Panwalkar (74) *Attorney, Agent, or Firm* — Knobbe, Martens, Olson & Bear, LLP (57) ABSTRACT

This disclosure relates to fractional-N phase-locked loops. A digital filter can filter out quantization noise from a modulator. Separate paths can process an integer part associated with an output signal of the digital filter and a fractional part associated with the output signal of the digital filter. The separate paths can be combined in the fractional-N phase-locked loop, for example, as a weighted sum.

20 Claims, 8 Drawing Sheets

(56) References Cited

U.S. PATENT DOCUMENTS

| 10,050,634 | B1* | 8/2018 | Zhao | H03L 7/0891 |
|---|---|---|---|---|
| 2009/0072913 | A1* | 3/2009 | Eikenbroek | H03L 7/081 |
| | | | | 331/18 |
| 2009/0274255 | A1 | 11/2009 | Li | |
| 2010/0329388 | A1 | 12/2010 | Ko | |
| 2016/0248431 | A1* | 8/2016 | Luo | G06F 1/04 |
| 2018/0302097 | A1* | 10/2018 | Guo | H03L 7/1976 |

OTHER PUBLICATIONS

Hosseini, et al., "Mathematical analysis of prime modulus quantizer MASH digital delta-sigma modulator," IEEE Transactions on Circuits and Systems—II: Express Beliefs, vol. 54, No. 12, Dec. 2007, pp. 1105-1109.

Hosseini, et al., "Maximum Sequence Length MASH Digital Delta-Sigma Modulators," IEEE Transactions on Circuits and Systems—I: Regular Papers, vol. 54, No. 12, Dec. 2007, pp. 2628-2638.

Jee, et al., "A 0.1-fref BW 1GHz Fractional-N PLL with FIR-Embedded Phase-Interpolator-Based Noise Filtering," IEEE International Solid-State Circuits Conference, Feb. 21, 2011.

Kong, et al., "A 2.4-GHz 6.4-mW Fractional-N Inductorless RF Synthesizer," IEEE Journal of Solid-State Circuits, vol. 52, No, 8, Aug. 2017, pp. 2117-2127.

Kong, et al., "A 2.4GHz RF Fractional-N Synthesizer with 0.25fREF BW," IEEE International Solid-State Circuits Conference, Feb. 8, 2017.

Yu, et al., "A 1GHz Fractional-N PLL Clock Generator with Low-OSR ΔΣ Modulation and FIR-Embedded Noise Filtering," IEEE International Solid-State Circuits Conference, Feb. 5, 2008.

\* cited by examiner

PHASE-LOCKED LOOP WITH FILTERED QUANTIZATION NOISE

CROSS-REFERENCE TO RELATED APPLICATION

This application claims the benefit of priority under 35 U.S.C. § 119(e) of U.S. Provisional Patent Application No. 62/639,821, filed Mar. 7, 2018, titled "PHASE-LOCKED LOOP WITH FILTERED QUANTIZATION NOISE," the disclosure of which is hereby incorporated by reference in its entirety.

FIELD OF DISCLOSURE

Embodiments of the present disclosure relate to electronic circuits and, in particular, to phase-locked loops.

BACKGROUND

A phase-locked loop is a circuit that generates an output signal having a phase related to a phase of an input signal. The output signal can have a frequency that is a multiple of a frequency of the input signal. Phase-locked loops can be used in a variety of applications, such as frequency synthesizers, clock recovery circuits, radio receivers, radio transmitters, test equipment, other radio frequency systems, and the like.

A fractional-N phase-locked loop is a type of phase-locked loop that implements a division ratio in a feedback path of the phase-locked loop, in which the division ratio has an integer part and a fractional part. A modulator, such as a delta sigma modulator, can switch an integer division ratio of an integer divider in the feedback path of the fractional-N phase-locked loop. This can implement the division ratio with the integer part and the fractional part for the feedback path of the fractional-N phase-locked loop.

The modulator can introduce quantization noise into the fractional-N phase locked loop. There is a desire to suppress the quantization noise. However, suppressing quantization noise from the modulator can involve engineering tradeoffs with having a relatively wide bandwidth for the fractional-N phase-locked loop.

SUMMARY OF THE DISCLOSURE

One aspect of this disclosure is a fractional-N phase-locked loop that includes a digital filter arranged to filter modulator quantization noise, a first path configured to process an integer part associated with an output signal of the digital filter and to provide a first path output signal, and a second path configured to process a fractional part associated with the output signal of the digital filter and to provide a second path output signal. The first path output signal and the second path output signal are combined in the fractional-N phase-locked loop.

The first path can include a divider in a feedback path of the fractional-N phase-locked loop and the second path can include an adjustable delay line coupled to the divider. The first path can include a first phase detector and the second path can include a second phase detector. The first path output signal and the second path output signal can be combined at a node between the output of a phase detector and an output of a voltage controlled oscillator of the fractional-N phase locked loop.

The fractional-N phase-locked loop can include a delta sigma modulator configured to generate the quantization noise. The digital filter can be a finite impulse response filter. An output of the digital filter can be coupled to a phase detector of the fractional-N PLL. The integer part can be an integer portion of the output signal of the digital filter adjusted by the fractional part from a previous cycle.

The fractional-N phase-locked loop can include circuit elements configured to combine the first path output signal and the second path output signal as a weighted sum. The fractional-N phase-locked loop can implement dynamic element matching to compensate for mismatches among the circuit elements.

The fractional-N phase-locked loop can perform interpolation at a reference frequency of a reference signal received by the fractional-N phase locked loop.

Another aspect of this disclosure is a method of frequency synthesis with quantization noise filtering. The method includes filtering quantization noise associated with a modulator of a fractional-N phase locked loop with a digital filter, processing a first part associated with an output of the digital filter with a first signal path to a first phase detector of the fractional-N phase-locked loop, and processing a second part associated with the output of the digital filter with a second signal path to a second phase detector of the fractional-N phase-locked loop, and combining outputs of the first and second phase detectors as a weighted sum.

The first signal path can include an integer divider in a feedback loop of the fractional-N phase-locked loop. The second signal path can include an adjustable delay line.

The first part can be an integer portion of an output signal of the digital filter for a current cycle adjusted by a fractional part from a previous cycle.

The method can further include providing a modulated output signal to the digital filter with a delta sigma modulator, in which the modulated output signal includes the quantization noise.

The method can further include performing dynamic element matching to compensate for mismatches among circuit elements used to form the weighted sum.

Another aspect of this disclosure is a fractional-N phase-locked loop configured to receive a reference signal having a reference frequency and provide an output signal having an output frequency. The fractional-N phase-locked loop includes a delta sigma modulator, a digital finite impulse response filter configured to filter quantization noise generated by the delta sigma modulator, and a phase detector having an input coupled to an output of the digital finite impulse response filter. The fractional-N phase-locked loop is configured to interpolate fractional cycle edges at the reference frequency.

The fractional-N phase-locked loop can include a second phase detector and a weighing circuit. The weighting circuit can provide a weighted sum of an output signal provided by the first phase detector and an output signal provided by the second phase detector. The fractional-N phase-locked loop can implement dynamic element matching to compensate for mismatches among circuit elements of the weighting circuit.

The fractional-N phase-locked loop can include an integer feedback divider of a feedback path of the fractional-N phase locked loop, in which the integer feedback divider is coupled between the digital filter and the phase detector. The fractional-N phase-locked loop can include an adjustable delay line that includes a first input coupled to the digital filter, a second input coupled to the integer divider, and an output coupled to the second phase detector.

For purposes of summarizing the disclosure, certain aspects, advantages and novel features of the innovations have been described herein. The innovations described in this disclosure each have several features, no single one of which is solely responsible for its desirable attributes. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION

The following detailed description of certain embodiments presents various descriptions of specific embodiments. However, the innovations described herein can be embodied in a multitude of different ways, for example, as defined and covered by the claims, in this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

There is a need for a method to widen the bandwidth of digital delta-sigma modulator (DDSM) based fractional-N phase-locked loops (PLLs) and to also suppress DDSM quantization noise. The design of DDSM based fractional-N PLLs typically involves a compromise between widening the loop bandwidth and suppressing the quantization noise. Multi-stage noise shaping (MASH) modulators can be employed where quantization noise is shaped to relatively high frequencies, peaking at half the sampling rate. Typically, one of the constraints defining a maximum closed loop bandwidth of such a PLL is maintaining stability while achieving sufficiently aggressive low pass filtering to suppress quantization noise to levels that meet spectral performance targets, such as transmit emission mask compliance in the context of wireless communications.

There are several factors that can motivate the desire to support higher PLL bandwidths. One or more of these factors, among others, can motivate widening PLL bandwidth. One factor is increasing modulation bandwidth of the PLL in the context of a polar or constant envelope transmitter. For example, this can obviate the additional physical circuit area (e.g., silicon die area), development cost, and the complexity overhead of a transmitter. Such benefits can be realized in a variety of contexts, such as a 2-point modulation calibration in a Bluetooth low energy (BLE) transmitter. Another factor is increasing agility by reducing acquisition time during frequency/phase lock. Suppression of voltage-controlled oscillator (VCO) noise within the loop bandwidth in type-I PLLs, which can offer smaller physical area solutions with better phase noise performance than their type-II PLL counterparts, is another factor. Another factor is suppression of remodulation distortion effects due to power amplifier (PA) pulling in polar transmitters.

Accordingly, architectures to decouple the tradeoffs between bandwidth and quantization noise suppression are desirable. Such PLLs are desirable in a variety of contexts, such as in the Internet of Things (IoT) space and beyond.

Aspects of this disclosure relate to a finite impulse response (FIR) filter to filter DDSM output samples for a fractional-N PLL to suppress quantization noise. An output associated with the FIR filter can be split into two paths, a first path associated with an integer part and a second path associated with a fractional part. The first path can include an integer divider of the feedback path of the fractional-N PLL. The second path can include an adjustable delay line. The first path and the second path can include different phase detectors. Outputs of the first path and the second path can be combined as a weighted sum. Dynamic element matching can be performed in implementing the weighting to form the weighted sum. The fractional-N PLL can perform interpolation at a reference frequency of a reference signal received by the fractional-N phase-locked loop. Interpolation at the reference frequency can result in significant power savings relative to interpolation at a frequency of a VCO output signal.

Fractional-N PLLs discussed herein can decouple the design of PLL bandwidth from the suppression of quantization noise. This can enable a variety of advantageous designs. For example, fractional-N PLLs discussed herein can have higher frequency agility through faster settling, lower in-band phase noise in type-I PLLs, and/or increased modulation bandwidth support in direct modulation transmitters, among other advantages. Fractional-N PLLs discussed herein can reduce power consumption and physical circuit area relative to other approaches to reduce modulator quantization noise.

In a fractional-N PLLs, a DDSM (e.g., a MASH 1-1-1 modulator) can produce a sequence of integer values that define the successive instantaneous division factors of a feedback divider in the feedback path of the fractional-N PLL. Embodiments discussed herein include a digital FIR filter arranged to filter the output signal of a DDSM. The coefficients of the digital FIR filter are typically fractional, resulting in a sequence of instantaneous fractional division factors. Embodiments discussed herein separate fractional and integer parts associated with the FIR filter output. The fractional part can be represented as a weighted integer division. This is equivalent to saying N+p/q=N*(q−1)/q+(N+p)/q. Fractional weighting and summation can be performed in the analog domain. Distinct phase detectors can be provided for the integer and fractional parts. Accordingly, the phase modulation information due to the FIR filtering of the DDSM can be preserved. The effect of weighting coefficient mismatch can be mitigated by dynamic element matching (DEM).

In a fractional-N PLL, a DDSM can provide a multi-level word taking on integer values within a range (e.g., within an integer range from −3 to +4 for an 8 level word). For each sample/counter cycle event, the DDSM output which includes the fractional part of the desired division factor is summed with the integer part to produce the instantaneous integer division factor to be loaded into the integer divider in the feedback loop of the fractional-N PLL. Equation 1 represents the average of the sequence of integer division ratios over time.

$$N_{AV} = N_{INT} + \frac{k}{\mod} \quad \text{(Equation 1)}$$

In Equation 1, $N_{AV}$ represents the average fractional division factor, $N_{INT}$ represents the integer part of $N_{AV}$, k represents the numerator of the fractional part (integer valued in the range [0, mod−1]), and mod represents the denominator of the fractional part. An example DDSM resolution is 226.

Figure 1:
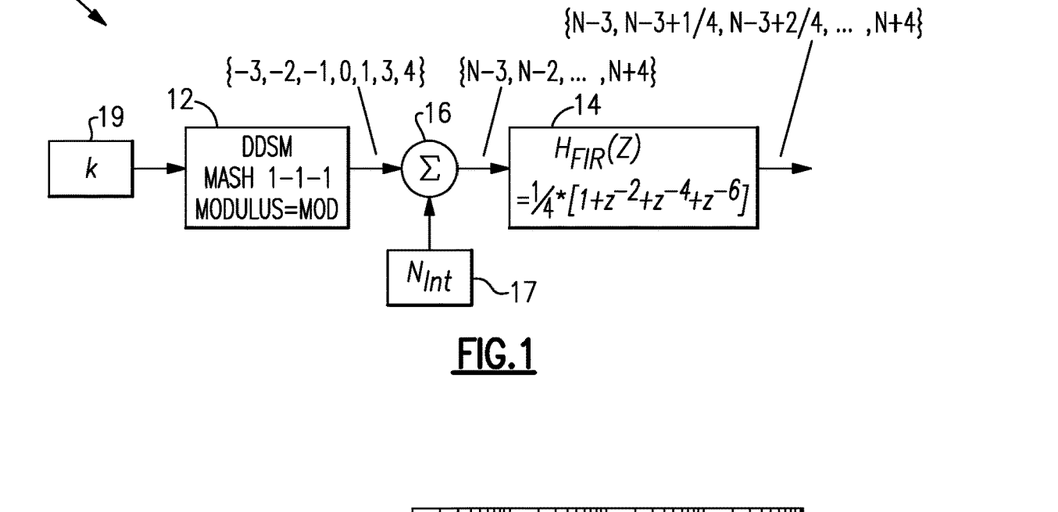
FIG. 1 is a schematic block diagram of a portion of the fractional-N phase-locked loop that includes a modulator and a digital filter arranged to filter an output of the modulator.

FIG. 1 is a schematic block diagram of a portion 10 of the fractional-N PLL that includes a DDSM 12 and a digital FIR filter 14. The illustrated DDSM 12 is a MASH 1-1-1 modulator that provides integer values within a range from −3 to +4. As illustrated, a summer 16 is arranged to sum an output of the DDSM 12 with an integer input $N_{INT}$ received at an integer input node 17. The DDSM 12 is arranged to generate the output signal based on a numerator of a fractional part k received at fractional input node 19. The output signal of the digital FIR filter 14 can be provided to a divider in the feedback loop of the fractional-N PLL. The divider can be an integer divider. The dividers discussed herein are generally frequency dividers that divide a frequency of an input signal by a divisor. In the example shown in FIG. 1, the digital FIR filter 14 has a transfer function represented by Equation 2.

$$H_{FIR}(z)=0.25*(1+z^{-2}+z^{-4}+z^{-6}) \quad \text{(Equation 2)}$$

Figure 2:
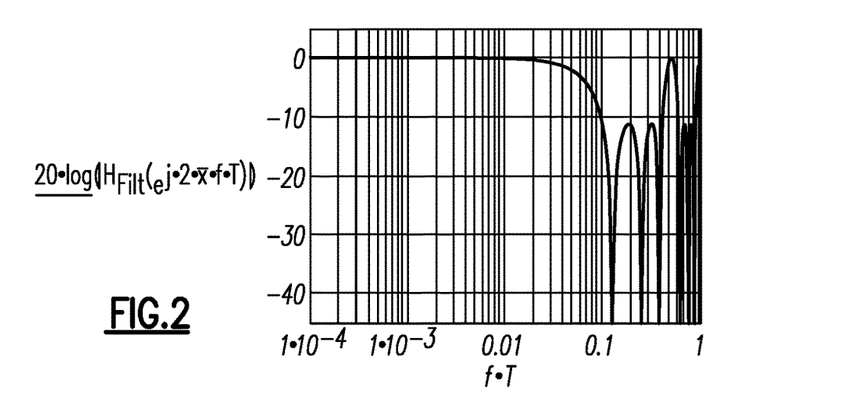
FIG. 2 is a graph that shows the magnitude of the transfer function of a filter of FIG. 1.

FIG. 2 is a graph that shows the magnitude of the transfer function of a digital FIR filter 14 of FIG. 1 with a transfer function represented by Equation 2. FIG. 2 illustrates three notches in the first Nyquist band located at ⅛*fs, ¼*fs and ⅜*fs, in which fs is the sampling rate.

The output signal of the digital FIR filter 14 of FIG. 1 with a transfer function represented by Equation 2 takes on values within a [−3, +4] range in 0.25 steps due to the 0.25 coefficients. An N-divider in a feedback loop of a fractional-N with fractional division with 0.25 cycle resolution can directly support the use of this digital FIR filter 14. In certain applications, such as multi-phase oscillators, such fractional division cycle resolution can be supported. However, in some other designs, only integer cycle division is supported and/or implemented and other techniques can affect the fractional division ratio called for by the output signal of the digital FIR filter 14. Embodiments discussed herein can realize an effective fractional cycle divide ratio with an integer cycle divider.

Even with the availability of M-phase oscillators and/or 1/M cycle resolution dividers, principles and advantages discussed herein can extend performance to allow FIR filters with rational coefficients of the form represented by Equation 3.

$$\frac{\alpha_i}{Q} = \frac{\alpha_i}{LM} \quad \text{(Equation 3)}$$

In Equation 3, $\alpha_i$ represents an integer numerator, Q represents the lowest common multiple of the coefficient denominators, L is an integer, and 1/M cycle is the resolution of the fractional cycle divider/multi-phase oscillator combination.

Embodiments discussed herein can generate a signal with a mean value retaining fractional cycle resolution with an integer feedback divider in a feedback path of the PLL. The desired fractional division can be split in its integer and fractional components. These components can then be expressed as the sum of two integers, divided by a common denominator corresponding to the desired fractional resolution.

Figure 3:
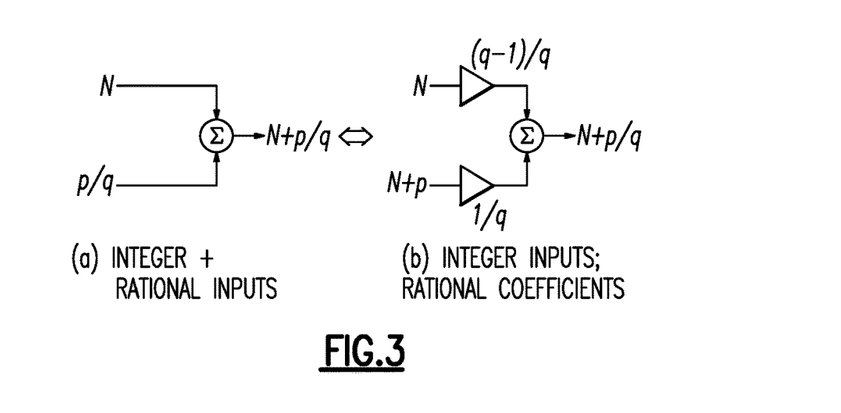
FIG. 3 is a diagram that illustrates how a sum of an integer input and a rational input can be equivalent to a sum of integer inputs divided by a common denominator.

FIG. 3 is a diagram that illustrates how a sum of an integer input and a rational input can be equivalent to a sum of integer inputs divided by a common denominator. As shown, N+p/q is equivalent to N*(q−1)/q+(N+p)/q.

Figure 4:
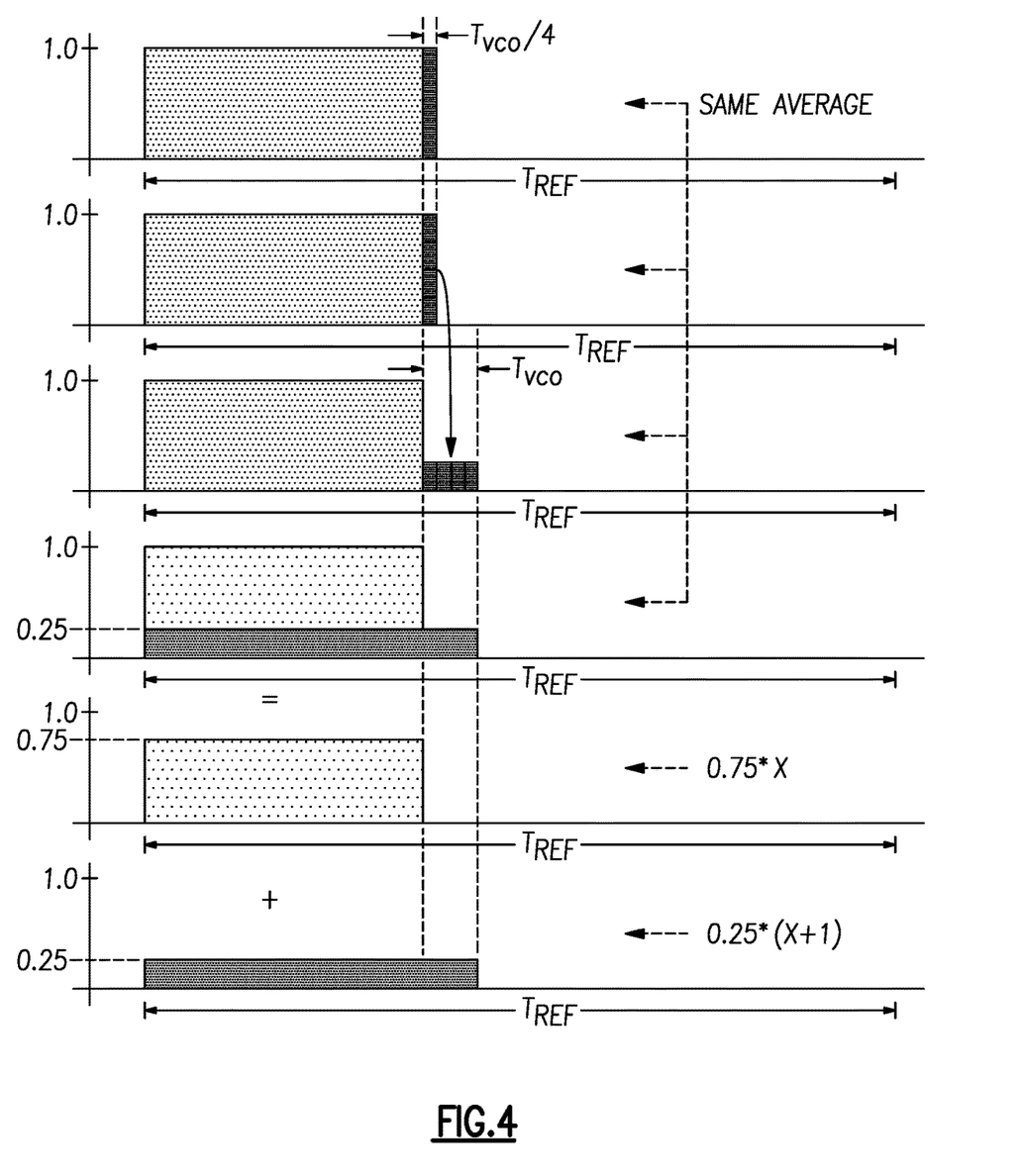
FIG. 4 is a graphical illustration of various waveforms that can be summed to provide the same average.

To realize a phase detector output pulse with an average value of X+¼ in a fractional-N PLL, two waveforms can be summed with appropriate weighting: ¾*X+¼*(X+1). FIG. 4 is a graphical illustration of various waveforms that can be summed to provide an average of X+¼. As shown in FIG. 4, a ¼ VCO cycle resolution can be maintained by summing two appropriately weighted waveforms where a second waveform is one VCO cycle longer in duration than a first waveform. This can be implemented by the fractional-N PLL of FIG. 6 and the fractional-N PLL of FIG. 10. As also shown in FIG. 4, a ¼ VCO cycle resolution can be maintained by changing the amplitude of a waveform for a positive integer number of VCO cycles.

Figure 5:
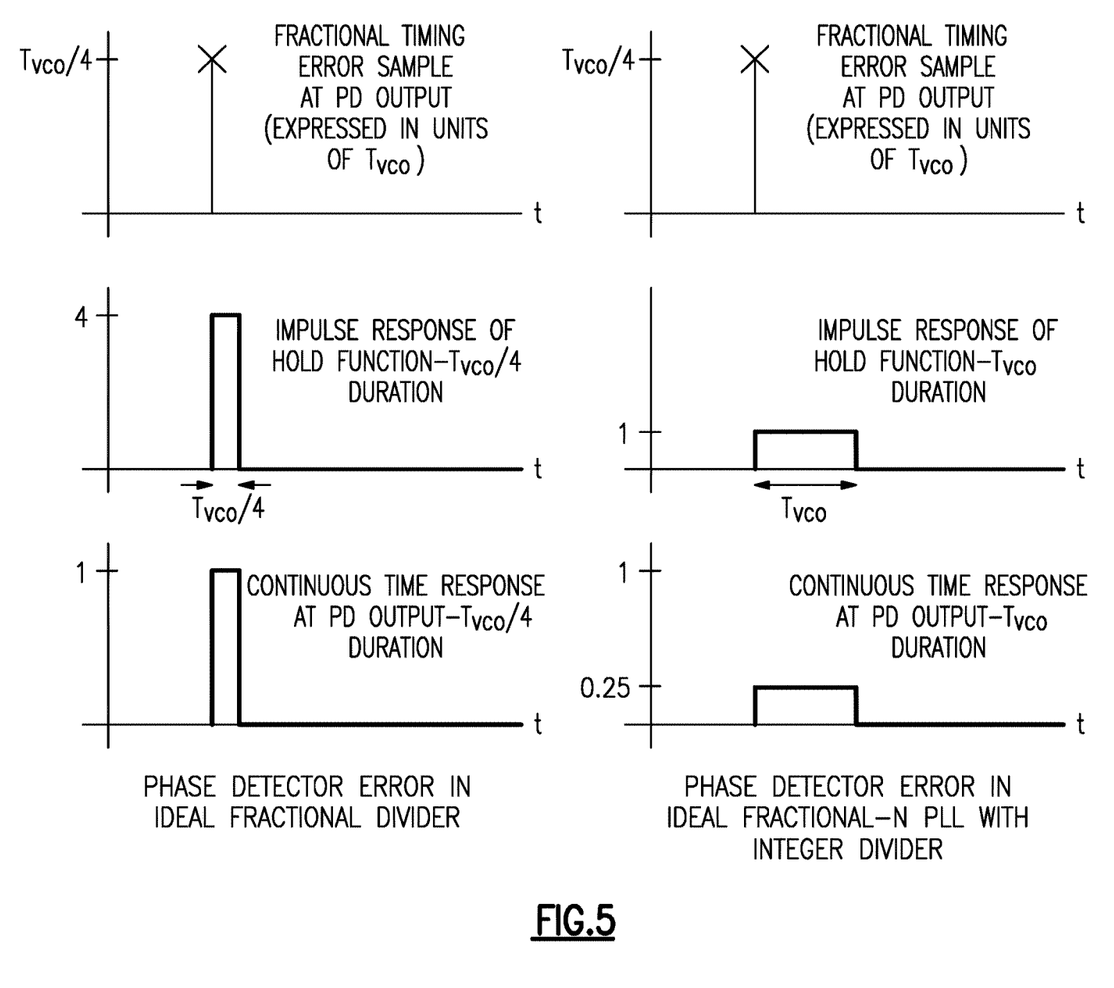
FIG. 5 conceptually illustrates sample and hold operations at a phase detector output for the fractional timing error samples at a phase detector output.
Figure 6:
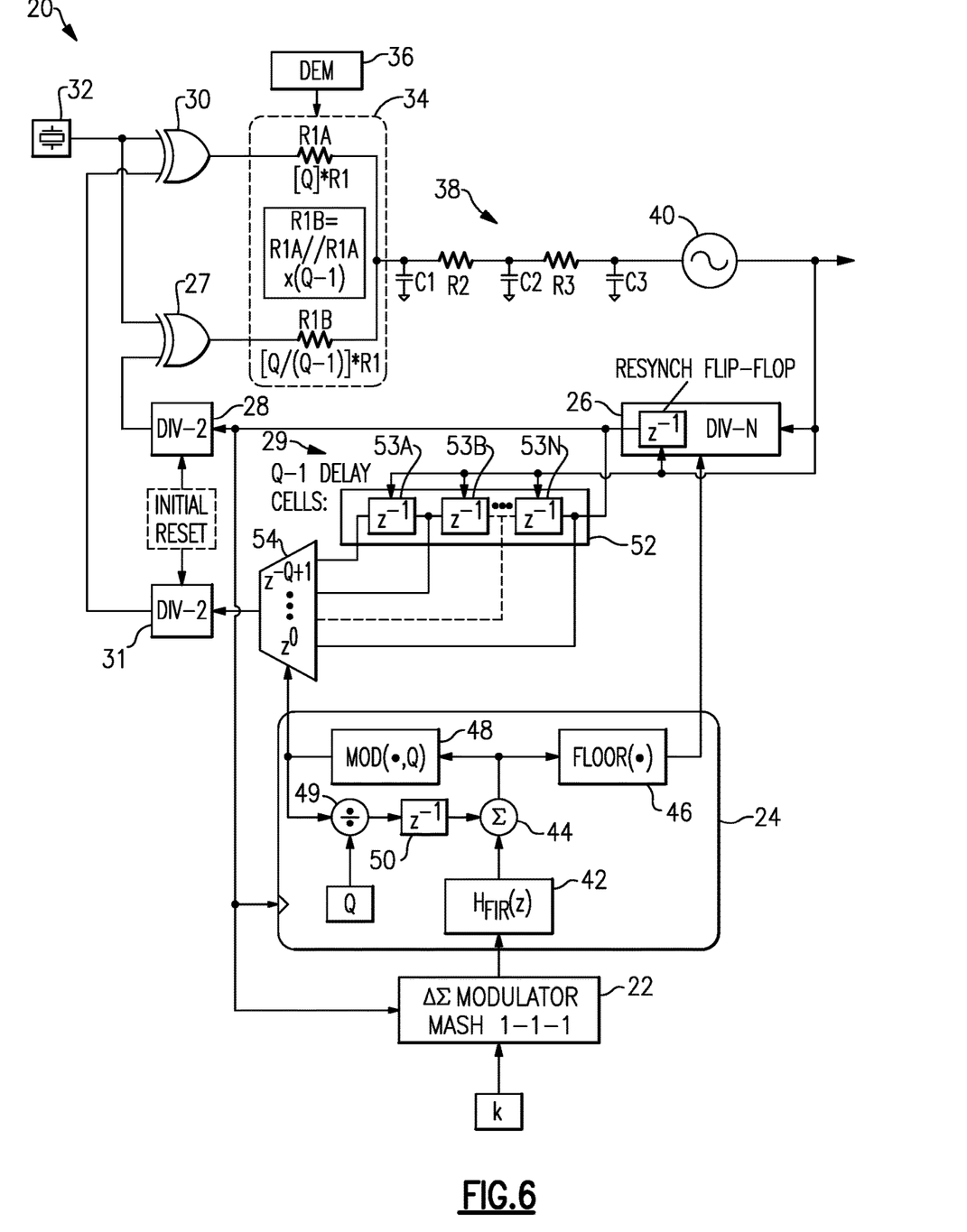
FIG. 6 is a schematic block diagram of a fractional-N phase-locked loop according to an embodiment.

FIG. 5 conceptually illustrates sample and hold operations at the phase detector output for the fractional timing error samples at the phase detector output for the cases of (a) an ideal fractional divider and (b) a fractional-N PLL of FIG. 6 having an integer divider. The graphs on the left side of FIG. 5 correspond to an ideal fractional divider. The graphs on the right side of FIG. 5 correspond to the fractional-N PLL of FIG. 6 having an integer divider. These graphs illustrate that pulses can be scaled in duration and magnitude to produce equivalent averages. For instance, a first pulse with magnitude of 4 for a duration of ¼*$T_{VCO}$ has an equivalent average as a second pulse with magnitude 1 for a duration of $T_{VCO}$. Similarly, a first pulse with magnitude of 1 for a duration of ¼*$T_{VCO}$ has an equivalent average as a second pulse with magnitude 0.25 for a duration of $T_{VCO}$.

Analysis of hold functions for ¼ and ¾ $T_{VCO}$ fractional errors for the cases of (a) an ideal fractional divider and (b) an integer cycle divider of FIG. 6 indicate that relatively low frequency information will be passed in both cases. The magnitude and phase responses for these cases can be used to determine where to locate FIR filter notches in the frequency domain for quantization noise suppression.

FIG. 6 is a schematic block diagram of a fractional-N PLL 20 according to an embodiment. The fractional-N PLL 20 is a type-I XOR phase detector based PLL. As illustrated, the fractional-N PLL 20 includes a modulator 22, a digital filtering and processing circuit 24, a feedback divider 26, a first phase detector 27, a first divide-by-2 circuit 28, an adjustable delay line 29, a second phase detector 30, a second divide-by-2 circuit 31, a reference signal input node 32, a weighting circuit 34, a dynamic element matching circuit 36, a loop filter 38, and a voltage-controlled oscillator (VCO) 40.

As illustrated, the modulator 22 can be a delta sigma modulator. For instance, the modulator 22 can be a MASH 1-1-1 delta sigma modulator. The output of the modulator 22 can be filtered by a digital filter of the digital filtering and processing circuit 24. The modulator 22 can implement any suitable features of the DDSM 12 of FIG. 1. Although not illustrated in FIG. 6, a summer can sum an output of the modulator 22 with an integer input, for example, as described with reference to FIG. 1. The output of the summer can be provided to the digital filtering and processing circuit 24.

In the fractional-N PLL 20, the integer and fractional parts of a fractional division factor are separated. The integer part is provided by the digital filtering and processing circuit 24 and applied to the feedback divider 26. As illustrated in FIG. 6, the feedback divider 26 is an integer divider. Accordingly, the feedback divider 26 can provide an output signal having a frequency that is divided by a positive integer relative to the frequency of an output signal of the VCO 40. The feedback divider 26 can include a resynch flip-flop as illustrated. The output signal of the feedback divider 26 is provided to the first phase detector 27 by way of the first divide-by-2 circuit 28. As illustrated, the first phase detector 27 is an XOR gate.

The fractional part is provided by the digital filtering and processing circuit 24 and applied to the adjustable delay line 29. The fractional part can select taps of a unit VCO cycle delayed version of an output edge of the feedback divider 26. The output of the adjustable delay line 29 can be provided to the second phase detector 31 by way of the second divide-by-2 circuit 31. The second divide-by-2 circuit 31 can encode alternative samples onto successive positive and negative edges. The second phase detector 30 can be an XOR gate.

The first and second phase detectors 27 and 30, respectively, can receive a reference signal from the reference signal input node 32. The reference signal can be provided by a crystal oscillator, for example. The fractional-N PLL 20 includes two phase detectors independent of the number of taps of the digital filter of the digital filtering and processing circuit 24. Two weighting coefficients are also applied by the weighting circuit 34 independent of the number of taps of the digital filtering and processing circuit 24. The reference signal can be generated by a crystal oscillator, for example. In the fractional-N PLL 20, outputs of the first phase detector 27 and the second phase detector 30 are weighted and combined with each other by the weighting circuit 34. The illustrated weighting circuit 34 includes ratiometric resistors R1B and R1A coupled to the outputs of the first and second phase detectors 27 and 30, respectively. The first and second phase detectors 27 and 30, respectively, provide respective output voltages. The weighting circuit 34 combines these voltages in the current domain at a summing node at which the resistors R1A and R1B are coupled to each other. As illustrated, the summing node is the node at which current flows in the top plate of capacitor C1 in FIG. 6. The output of the weighting circuit 34 can correspond to the fourth graph from the top shown in FIG. 4.

The dynamic element matching (DEM) circuit 36 can provide dynamic element matching to mitigate the effects of resistor mismatch in the weighting circuit 34 due to manufacturing tolerances. The resistors R1A and R1B of the weighting circuit 34 can be implemented by an array of resistors. Every cycle or half cycle, for example, each of the resistors R1A and R1B can be formed from different parts of the array of resistors for dynamic element matching. Such dynamic element matching can average out variations in resistance of resistors of the array. The variations in resistance can be due to process variations, for example. Dynamic element matching can swap which parts of a resistor array are included in the resistor R1A and the resistor R1B in a manner that exhibits statistical randomness.

In the fractional-N PLL 20, interpolation is performed at a frequency of a reference signal provided to the reference signal input node 32. This can result in significant power savings relative to a similar fractional-N PLL performing interpolation at a frequency of a VCO output signal.

The outputs of the first and second phase detectors 27 and 30 are connected to the loop filter 38. As illustrated, the loop filter 38 includes resistors R2 and R3 and capacitors C1, C2, and C3. The loop filter 38 can be a low pass filter arranged to average the weighted sum of the outputs of the phase detectors 27 and 30. The output of the loop filter 38 is coupled to an input of the VCO 40. The VCO 40 can provide an output signal of the fractional-N PLL 20. The output signal of the fractional-N PLL 20 can have frequency corresponding to the frequency of the reference signal divided by the fractional division ratio of the fractional-N PLL 20. The output of the VCO 40 is also coupled to an input of the feedback divider 26 in the feedback loop of the fractional-N PLL 20.

The digital filtering and processing circuit 24 of FIG. 6 will now be discussed in more detail. As illustrated, the digital filtering and processing circuit 24 includes a digital filter 42, an adjustment circuit 44, a floor circuit 46, a modulus circuit 48, a divider circuit 49, and a delay circuit 50. The digital filter 42 is arranged to filter an output of the modulator 22. This can filter out the quantization noise associated with the modulator 22. The digital filter 42 can be a digital FIR filter as illustrated. For instance, the digital filter 42 can implement any suitable features of the digital FIR filter 14 of FIG. 1. The adjustment circuit 44 can adjust the output signal of the digital filter 42 by a fractional part of a previous cycle to compute the integer and fractional parts associated with a present cycle. For instance, the fractional part of a previous cycle can be added to an output of the digital filter 42 for a current cycle using the adjustment circuit 44. This can cause reload events of the feedback divider 26 to only occur on timestamps corresponding to unit VCO cycles.

The output of the adjustment circuit 44 includes an integer part associated with an output of the digital filter 42 and a fractional part associated with the output of the digital filter 42. The floor circuit 46 can provide the integer part to the feedback divider 26. The modulus circuit 48 can provide the fractional part to the adjustable delay line 29. The divider circuit 49 and the delay circuit 50 form a feedback loop from the output of the modulus circuit 48 to the adjustment circuit 44. This can provide the fractional part from a previous cycle to the adjustment circuit 44, which can be used to adjust the output of the digital filter 42, for example, as discussed above.

The adjustable delay line 29 can include delay circuit 52 that includes a plurality of delay cells 53A, 53B, . . . , 53N and a multiplexer 54. The delay cells 53A to 53N can delay the output of the feedback divider 26 by different amounts. The different amounts can be in increments of a cycle or half cycle of an output signal of the VCO 40. The output of the modulus circuit 48 can be provided to select which delayed version of the output signal of the feedback divider 26 to provide to the second phase detector 30 by way of the divide-by-2 circuit 31. Any other suitable adjustable delay line 29 can alternatively or additionally be implemented.

Figure 7:
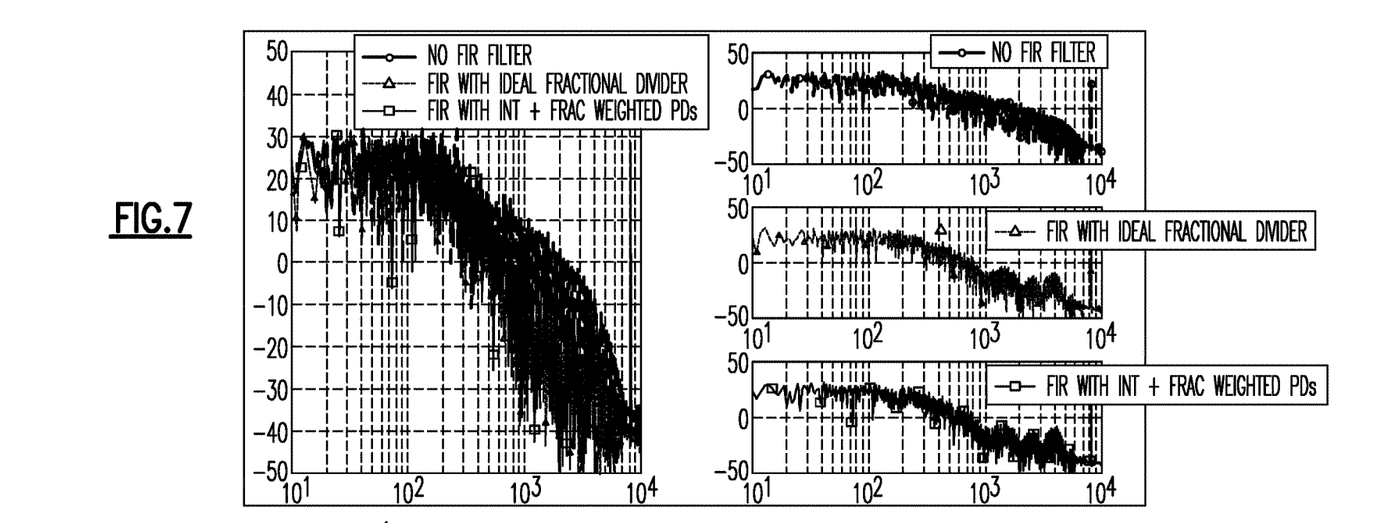
FIG. 7 shows graphs of spectral analysis of simulations of the fractional-N phase-locked loop of FIG. 6 compared to other fractional-N phase-locked loops.

FIG. 7 shows graphs of spectral analysis of simulations of the fractional-N PLL 20 of FIG. 6 compared to other fractional-N PLLs. The top right graph shows spectral analysis of a fractional-N PLL with an unfiltered MASH 1-1-1 modulator. The middle right graph shows spectral analysis of a fractional-N PLL with a MASH 1-1-1 modulator filtered by a digital FIR filter and provided to an ideal fractional cycle divider in a feedback loop of a fractional-N PLL. The bottom right graph shows spectral analysis of the fractional-N PLL 20 of FIG. 6 in which the digital filter 42 is a digital FIR filter with a transfer function corresponding to FIG. 2. In FIG. 7, quantization noise is supressed in the ideal case over the expected frequency range per the transfer function of a FIR filter corresponding to the transfer function of FIG. 2. Furthermore, the quantization noise spectrum corresponding to the the fractional-N PLL 20 overlays the ideal case and suppresses quantization noise as expected.

Figure 8:
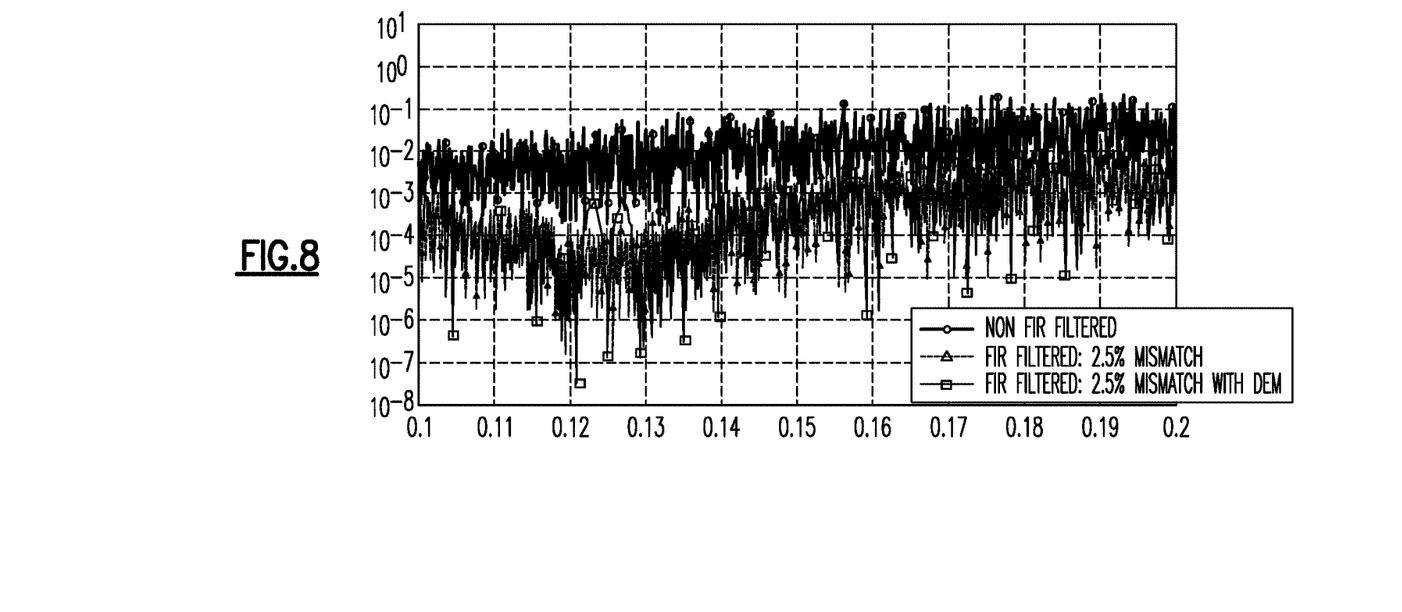
FIG. 8 shows a filtered quantization noise spectrum that includes resistor mismatch in the weighting circuit of FIG. 6 and dynamic element matching.

The impact of weighting coefficient mismatch prior to summation was evaluated, both with and without DEM. FIG. 8 shows a FIR filtered quantization noise spectrum that includes resistor mismatch in the weighting circuit 34 of FIG. 6 and DEM. The curves in FIG. 8 correspond to a fractional-N PLL without digital FIR filtering of quantization noise, the fractional-N PLL 20 of FIG. 6, and a fractional-N PLL corresponding to the fractional-N PLL 20 of FIG. 6 without DEM. A 2.5% mismatch was evaluated. This mismatch induced some unwanted spectral components degrading suppression within the first notch without DEM. DEM mitigates this degradation, but can add relatively low frequency dither noise. For a mismatch of 2.5%, the low frequency dither noise can be non-dominant and/or negligible in an overall PLL design targeting a variety of applications, such as BLE applications.

Figure 9:
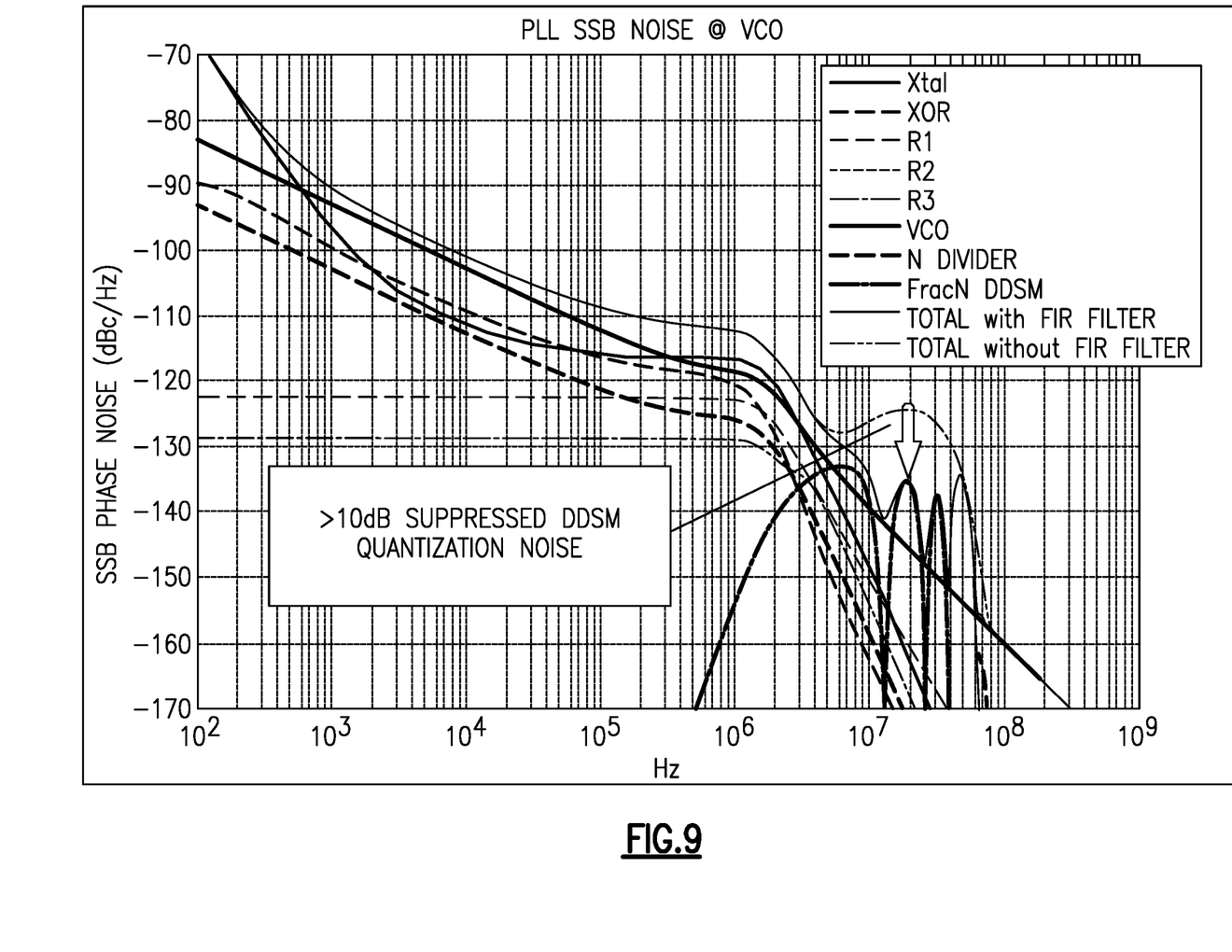
FIG. 9 is a graph that illustrates benefits of filtering modulator quantization noise in the fractional-N phase-locked loop of FIG. 6.

FIG. 9 is a graph that illustrates benefits of FIR filtering of DDSM quantization noise in the fractional-N PLL of FIG. 6. This graph represents a PLL design targeting approximately 1.8 Megahertz (MHz) closed loop bandwidth to obviate a 2-point modulation and associated circuitry and calibration to support 1 Mbps BLE Release 4. The FIR filtering technique of FIG. 6 can allow grater that 10 decibel (dB) suppression of DDSM quantization noise beyond the loop bandwidth of the PLL.

The principles and advantages discussed herein are applicable to a variety of PLLs. While the fractional-N PLL 20 of FIG. 6 is an XOR phase detector type-I PLL, any suitable principles and advantages discussed herein can be applied to other PLLs. For example, a type-II charge pump PLL will be described with reference to FIG. 10.

Figure 10:
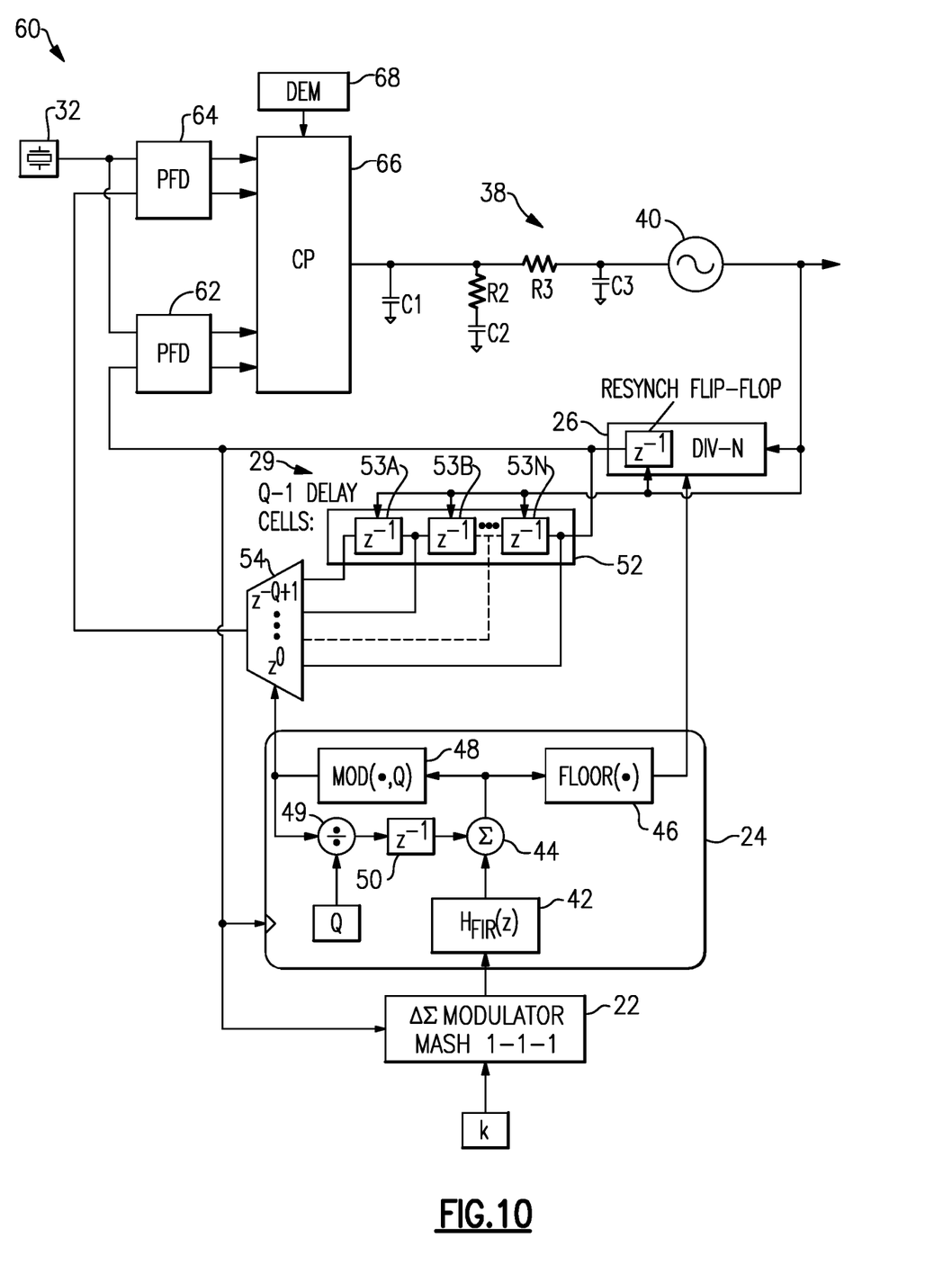
FIG. 10 is a schematic block diagram of a fractional-N phase-locked loop according to an embodiment.

FIG. 10 is a schematic block diagram of a fractional-N PLL 60 according to an embodiment. The fractional-N PLL 60 is a type-II charge pump PLL. The fractional-N PLL 60 is similar to the fractional-N PLL 20 of FIG. 6, except that the fractional-N PLL 60 is a type-II PLL, has different phase detectors (phase frequency detectors instead of XOR gates), includes a charge pump circuit, implements DEM for different circuit elements (current sources instead of resistors), and omits divide-by-2 circuits of FIG. 6.

In the fractional-N PLL 60, the phase detectors are phase frequency detectors (PFDs) 62 and 64. PFDs can be implemented by flip-flops, for example. PFDs can be responsive to only 1 signal edge (e.g., a rising edge or a falling edge). Accordingly, the divide-by-2 circuits of 28 and 31 of the fractional-N PLL 20 of FIG. 6 can be omitted. As shown in FIG. 10, a first PFD 62 is configured to receive the output of the feedback divider 26 and a second PFD 64 is configured to receive an output of the adjustable delay line 29.

A charge pump circuit 66 of the fractional-N PLL 60 can implement a weighted sum of the outputs of the first PFD 62 and the second PFD 64. An output of the charge pump circuit 66 is provided to the loop filter 38 of the fractional-N PLL 60. The charge pump circuit 66 can include current sources and capacitor(s). The current sources can charge and/or discharge the capacitor(s). Current sources in the charge pump circuit 66 can implement weighting for the outputs of the PFDs 62 and 64. A DEM circuit 68 can provide dynamic element matching to mitigate the effects of mismatches associated with current sources in the charge pump circuit 66.

The fractional-N PLLs of FIGS. 6 and 10 each form a weighted sum at a node between phase detectors and a loop filter. Any suitable principles and advantages discussed herein can be applied to fractional-N PLLs that combine outputs from two separate paths associated with integer and fractional parts of an output of a digital filter at a different node in the fractional-N PLL. The different node can be in a signal path between the phase detectors and an output of a VCO. For instance, outputs of two separate phase detectors can be provided to separate loop filters and the outputs of the separate loop filters can be combined to form a weighted sum.

The fractional-N PLLs of FIGS. 6 and 10 each include circuit elements to form a weighted sum of phase detector outputs. Any suitable principles and advantages discussed herein can be applied to fractional-N PLLs that include an adjustable gain element arranged to adjust a gain at an output of a phase detector. This can form a waveform as shown in the third graph from the top in FIG. 4. As an example, outputs from the adjustable delay line 29 and the feedback divider 26 of FIG. 6 and/or FIG. 10 can be combined with one or more logic gates (e.g., an OR gate) and provided to a single phase detector. With such a design, an adjustable gain element (e.g., an adjustable resistance circuit or an adjustable current source) can adjust the gain of the output of the single phase detector based on whether one or both of the outputs of the adjustable delay line 29 and the feedback divider 26 are asserted.

Figure 11:
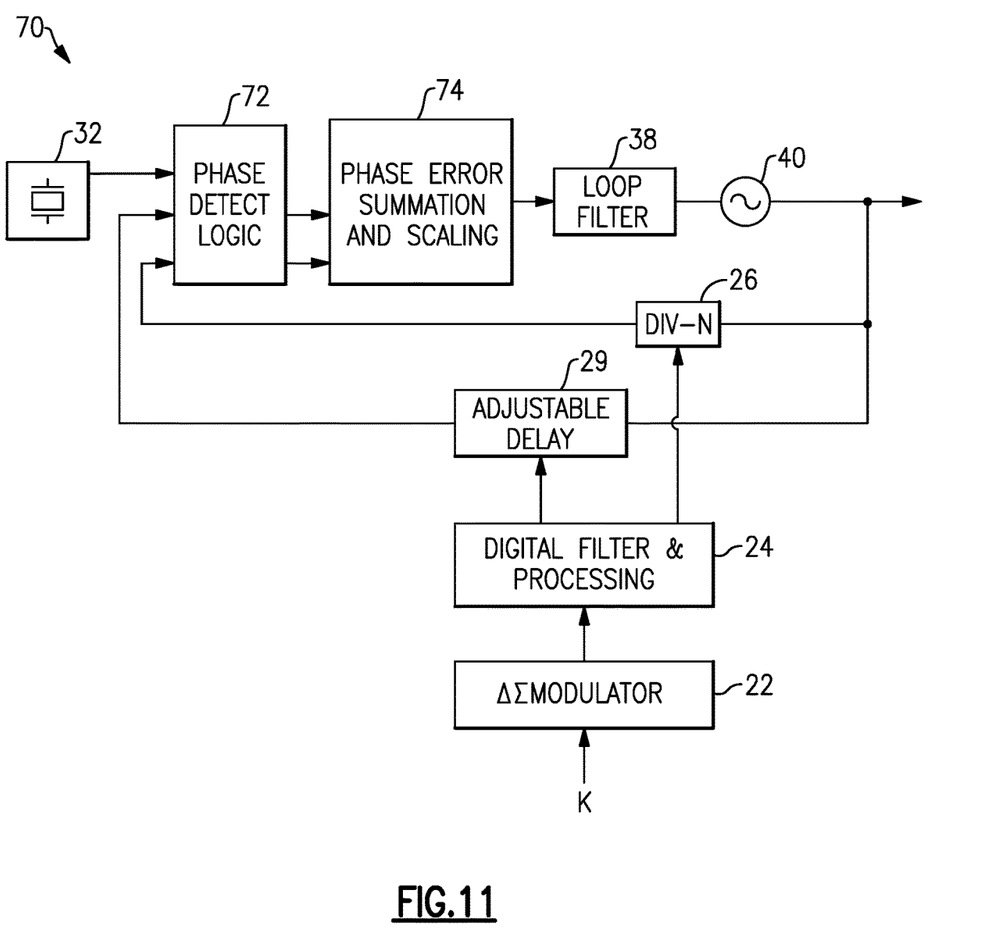
FIG. 11 is a schematic block diagram of a fractional-N phase-locked loop according to another embodiment.

FIG. 11 is a schematic block diagram of a fractional-N PLL 70 according to an embodiment. As illustrated, the fractional-N PLL 70 includes a modulator 22, a digital filtering and processing circuit 24, a feedback divider 26, an adjustable delay line 29, a reference signal input node 32, phase error detect logic circuit 72, a phase error summation and scaling circuit 74, a loop filter 38, and a VCO 40.

The phase error detect logic circuit 72 includes circuitry configured to perform phase error detection for the fractional-N PLL 70 based on signals from the adjustable delay line 29, the feedback divider 26, and the reference signal input node 32. The phase error detect logic circuit 72 can compare the phase of two digital input signals with a clock reference signal for phase error detection. As an example, the phase error detect logic circuit 72 can include the circuitry coupled between the adjustable delay line 29 and the weighting circuit 34 of FIG. 6 and the circuitry coupled between the feedback divider 26 and the weighting circuit 34 of FIG. 6. As another example, the phase error detect logic circuit 72 can include the circuitry coupled between the adjustable delay line 29 and the charge pump 66 of FIG. 10 and the circuitry coupled between the feedback divider 26 and the charge pump 66 of FIG. 10. The phase error detector logic circuit 72 can be include different circuitry than the embodiments of FIGS. 6 and 10.

The phase error summation and scaling circuit 74 can scale and linearly combine outputs of the phase error detector logic circuit 72. For example, the phase error summation and scaling circuit 74 can linearly sum and combine phase error using a resistive network with appropriate resistor/voltage scaling. The fractional-N PLL 20 of FIG. 6 is an example of this in a type-I PLL. As another example, the phase error summation and scaling circuit 74 can linearly combine phase error in a charge pump circuit with appropriate current scaling. The fractional-N PLL 60 of FIG. 10 is an example of this in a type-II PLL. The summation and scaling of phase error can be performed in other ways that those described with reference to FIG. 6 and FIG. 10.

Any of the principles and advantages discussed herein can be applied to other systems, devices, integrated circuits, electronic apparatus, or methods, not just to the embodiments described above. For instance, the principles and advantages discussed herein can be applied to any suitable PLL, a PLL in a transmitter, a PLL in a receiver, a PLL in a transceiver, etc. The elements and operations of the various embodiments described above can be combined to provide further embodiments. The principles and advantages of the embodiments can be used in connection with any other systems, devices, integrated circuits, apparatus, or methods that could benefit from any of the teachings herein.

Aspects of this disclosure can be implemented in various electronic devices. Examples of the electronic devices can include, but are not limited to, consumer electronic products, parts of electronic products such as integrated circuits, electronic test equipment, wireless communication devices, personal area network communication devices, cellular communications infrastructure such as a base station, vehicular electronics such as automotive electronics, etc. Further, the electronic devices can include unfinished products.

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, systems, devices, and integrate circuits described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A fractional-N phase-locked loop with reduced quantization noise, the fractional-N phase-locked loop comprising:
a digital filter arranged to suppress modulator quantization noise shaped by a modulator to a level that meets a spectral performance target;
a first path configured to process an integer part associated with an output signal of the digital filter and to provide a first path output signal; and
a second path configured to process a fractional part associated with the output signal of the digital filter and to provide a second path output signal, wherein the first path output signal and the second path output signal are combined in the fractional-N phase-locked loop,
wherein the first path includes a divider in a feedback path of the fractional-N phase-locked loop and the second path includes an adjustable delay line coupled to the divider.

2. The fractional-N phase-locked loop of claim 1, wherein the integer part is an integer portion of the output signal of the digital filter adjusted by the fractional part from a previous cycle.

3. The fractional-N phase-locked loop of claim 1, further comprising a delta sigma modulator configured to generate the quantization noise.

4. The fractional-N phase-locked loop of claim 1, wherein the modulator is a multi-stage noise shaping (MASH) modulator having an output coupled to an input of the digital filter.

5. The fractional-N phase-locked loop of claim 1, wherein an output of the digital filter is coupled to a phase detector of the fractional-N PLL.

6. The fractional-N phase-locked loop of claim 1, wherein the first path comprises a first phase detector and the second path comprises a second phase detector.

7. The fractional-N phase-locked loop of claim 1, wherein the first path output signal and the second path output signal are combined at a node between the output of a phase detector and an output of a voltage-controlled oscillator of the fractional-N phase-locked loop.

8. The fractional-N phase-locked loop of claim 1, wherein the fractional-N phase-locked loop performs interpolation at a reference frequency of a reference signal received by the fractional-N phase-locked loop.

9. A fractional-N phase-locked loop with reduced quantization noise, the fractional-N phase-locked loop comprising:
- a digital filter arranged to suppress modulator quantization noise;
- a first path configured to process an integer part associated with an output signal of the digital filter and to provide a first path output signal; and
- a second path configured to process a fractional part associated with the output signal of the digital filter and to provide a second path output signal, wherein the first path output signal and the second path output signal are combined in the fractional-N phase-locked loop,
- wherein the integer part is an integer portion of the output signal of the digital filter adjusted by the fractional part from a previous cycle.

10. The fractional-N phase-locked loop of claim 9, further comprising circuit elements configured to combine the first path output signal and the second path output signal as a weighted sum.

11. The fractional-N phase-locked loop of claim 10, wherein the fractional-N phase-locked loop is configured to implement dynamic element matching to compensate for mismatches among the circuit elements.

12. The fractional-N phase-locked loop of claim 9, wherein the fractional-N phase-locked loop performs interpolation at a reference frequency of a reference signal received by the fractional-N phase-locked loop.

13. A method of frequency synthesis with quantization noise filtering, the method comprising:
- suppressing, with a digital filter, quantization noise shaped by a modulator of a fractional-N phase-locked loop to a level that meets a spectral performance target;
- processing a first part associated with an output of the digital filter with a first signal path to a first phase detector of the fractional-N phase-locked loop; and
- processing a second part associated with the output of the digital filter with a second signal path to a second phase detector of the fractional-N phase-locked loop; and
- combining outputs of the first and second phase detectors as a weighted sum,
- wherein the first part is an integer portion of an output signal of the digital filter for a current cycle adjusted by a fractional part from a previous cycle.

14. The method of claim 13, wherein the first signal path comprises an integer divider in a feedback loop of the fractional-N phase-locked loop, and the second signal path comprises an adjustable delay line.

15. The method of claim 13, further comprising providing a modulated output signal to the digital filter with a delta sigma modulator, the modulated output signal comprising the quantization noise.

16. The method of claim 13, further comprising performing dynamic element matching to compensate for mismatches among circuit elements used to form the weighted sum.

17. A fractional-N phase-locked loop configured to receive a reference signal having a reference frequency and provide an output signal having an output frequency, the fractional-N phase-locked loop comprising:
- a delta sigma modulator;
- a digital finite impulse response filter configured to filter quantization noise generated by the delta sigma modulator; and
- a phase detector having an input coupled to an output of the digital finite impulse response filter, wherein the fractional-N phase-locked loop is configured to interpolate fractional cycle edges at the reference frequency.

18. The fractional-N phase-locked loop of claim 17, further comprising a second phase detector and a weighing circuit, the weighting circuit configured to provide a weighted sum of an output signal provided by the first phase detector and an output signal provided by the second phase detector.

19. The fractional-N phase-locked loop of claim 18, wherein the fractional-N phase-locked loop is configured to implement dynamic element matching to compensate for mismatches among circuit elements of the weighting circuit.

20. The fractional-N phase-locked loop of claim 18, further comprising:
- an integer feedback divider of a feedback path of the fractional-N phase-locked loop, the integer feedback divider coupled between the digital filter and the phase detector; and
- an adjustable delay line comprising a first input coupled to the digital filter, a second input coupled to the integer divider, and an output coupled to the second phase detector.

* * * * *